(12) United States Patent
Hui et al.

(10) Patent No.: US 6,479,411 B1
(45) Date of Patent: Nov. 12, 2002

(54) METHOD FOR FORMING HIGH QUALITY MULTIPLE THICKNESS OXIDE USING HIGH TEMPERATURE DESCUM

(76) Inventors: Angela T. Hui, 362 Pilgrim Lp, Fremont, CA (US) 94539; Jusuke Ogura, 10183 Denison Ave., Cupertino, CA (US) 95014

( * ) Notice: Subject to any disclaimer, the term of this patent is extended or adjusted under 35 U.S.C. 154(b) by 0 days.

(21) Appl. No.: 09/532,347

(22) Filed: Mar. 21, 2000

(51) Int. Cl.$^7$ ............................................. H01L 21/311
(52) U.S. Cl. ....................... 438/963; 438/694; 438/906; 438/942; 438/948
(58) Field of Search ................. 438/694, 906, 438/942, 945, 946, 948, 963

(56) References Cited

U.S. PATENT DOCUMENTS

| | | | |
|---|---|---|---|
| 4,496,423 A | 1/1985 | Walton | 156/345 |
| 4,591,547 A | 5/1986 | Brownell | 430/312 |
| 4,789,622 A | * 12/1988 | Leyrer et al. | 430/286.1 |
| 5,016,332 A | * 5/1991 | Reichelderfer et al. | 29/25.01 |
| 5,106,770 A | 4/1992 | Bulat et al. | 437/40 |
| 5,171,393 A | 12/1992 | Moffat | 156/345 |
| 5,356,486 A | 10/1994 | Sugarman, et al. | 136/230 |
| 5,516,626 A | 5/1996 | Ohmi et al. | 430/328 |
| 5,672,521 A | 9/1997 | Barsan et al. | 438/276 |
| 5,882,489 A | 3/1999 | Bersin et al. | 204/192.35 |
| 5,926,708 A | 7/1999 | Martin | 438/241 |
| 6,130,169 A | * 10/2000 | Shields et al. | 438/725 |

FOREIGN PATENT DOCUMENTS

| | | | |
|---|---|---|---|
| EP | 0299243 | 6/1988 | C23C/16/48 |
| EP | 0477035 | 9/1991 | G03F/1/14 |
| GB | 2339479 A | * 1/2000 | G03F/7/40 |
| WO | 9631805 | 10/1996 | G03F/7/008 |

OTHER PUBLICATIONS

International Search Report.

* cited by examiner

Primary Examiner—Stephen D. Meier
Assistant Examiner—Christy Novacek

(57) ABSTRACT

A method for forming high quality multiple thickness oxide layers having different thicknesses by eliminating descum induced defects. The method includes forming an oxide layer, masking the oxide layer with a photoresist layer, and developing the photoresist layer to expose at least one region of the oxide layer. The substrate is then heated and descummed to remove any residue resulting from developing the photoresist. Alternatively, the photoresist layer may be cured prior to heating and descumming the substrate. The oxide layer is then etched, and the remaining photoresist is stripped before another layer of oxide is grown on the substrate.

21 Claims, 6 Drawing Sheets

METHOD FOR FORMING HIGH QUALITY MULTIPLE THICKNESS OXIDE USING HIGH TEMPERATURE DESCUM

FIELD OF THE INVENTION

The present invention pertains to the field of integrated circuit devices and manufacturing processes for the same. More particularly, this invention relates to the formation of a high quality multiple thickness oxide layers on a silicon wafer substrate.

BACKGROUND OF THE INVENTION

Non-volatile memory devices are currently in widespread use in electronic components that require the retention of information when electrical power is terminated. Non-volatile memory devices include read-only-memory (ROM), programmable-read-only memory (PROM), erasable-programmable-read-only memory (EPROM), and electrically-erasable-programmable-read-only-memory (EEPROM) devices. EEPROM devices differ from other non-volatile memory devices in that they can be electrically programmed and erased. Flash EEPROM devices are similar to EEPROM devices in that memory cells can be programmed and erased electrically. However, Flash EEPROM devices enable the erasing of all memory cells in the device using a single electrical current pulse.

High voltage circuit elements such as program and erase transistors are usually formed on a wafer substrate with a relatively thick gate oxide layer. Such relatively thick gate oxide layers are usually required to prevent transistor circuit breakdown in such a high voltage environment. On the other hand, it is preferable that the low voltage circuitry is implemented with relatively thin gate oxide layers on the wafer substrate. Such thin gate oxide layers typically increase the speed of such circuit elements having relatively short gate lengths and thin oxide layers typically provide increased operation speeds.

In addition, as process technologies evolve toward shorter and shorter gate lengths it is desirable to reduce the thickness of the gate oxide layer even further in order to achieve greater operating speed. However, some circuit elements contained on such integrated circuit devices may not be scalable.

Non-volatile memory devices, such as flash EEPROMs require the formation of flash memory cells that include tunnel oxide layers on the wafer substrate. Such tunnel oxide layers may be thinner than high voltage oxide layers on the wafer substrate. However, such tunnel oxide layers usually cannot be scaled down in thickness in the same manner as low voltage oxide layers. Such flash memory cells, for example, typically suffer from significant endurance and data retention problems if the tunnel oxide layers are too thin.

Therefore, non-volatile memory devices can usually benefit from the formation of differing oxide thicknesses on the same wafer substrate. Transistors with relatively thick select gate oxide layers can accommodate high voltage program and erase operations while logic transistors with relatively thin gate oxide layers can yield speed advantages as process technologies evolve toward smaller circuit element dimensions. In addition, the thickness of tunnel oxide layers for flash memory cells can be scaled for reliability independent of the gate dimensions and oxide thickness of the high and low voltage transistors.

One method of forming high quality multiple thickness oxide layers involves multiple masking and oxide formation steps. For example, a first oxide layer, usually the thickest oxide layer, is initially grown on the wafer substrate. Thereafter, a layer of photoresist is formed on the first oxide layer. A pattern is formed on the photoresist layer by exposing the photoresist through a mask. The photoresist is then developed and removed, leaving a portion of the oxide layer exposed. Subsequently, the first oxide layer is etched and the remaining photoresist is stripped. A second layer of oxide is then grown on the wafer substrate. The second oxide layer forms a thin oxide layer on the wafer substrate while a thicker oxide layer is formed by the combination of the first and second oxide layers. This process can be repeated to form additional oxide layers with various thicknesses throughout the process flow.

During and after development of the photoresist layer, the unmasked or exposed portion of the oxide layer may become contaminated. For example, a thin film, undetectable on visual inspection, may form on the exposed portion of the oxide layer. This film may consist of photoresist residue such as dried developer and undissolved pieces of photoresist. Thus, it is usually necessary to subject the unmasked portion of the oxide layer to a cleaning or descumming process to remove the resist residue. The unmasked or exposed portion of the oxide layer is often descummed or cleaned with $O_2$, $O_2/N_2$ or $O_2/N_2$—$H_2$ chemistries in a barrel asher or a downstream single wafer asher.

Although the descum process is relatively short in order to avoid any surface damage of the exposed oxide layer, the descum process itself leaves contaminants on the oxide layer. The contaminants appear as dark spots on the oxide layer under a high resolution scanning electron microscope (SEM) as shown in FIG. 1. An analysis of the dark spots shows that they consist of sulfur compounds and small hydrocarbons, most likely photo active compound, left over from the development of the photoresist. These dark spots or defects on the surface of the exposed oxide layer interact with subsequent processing steps, which creates processing problems and degrades reliability and yield.

For example, when a wet oxide etch is carried out after descum to remove the exposed portion of an oxide layer, the oxide layer under the dark spots cannot be completely removed. Thus, the dark spots act as a micromask on the exposed portion of the oxide layer. As a result of the dark spots, a subsequently grown oxide layer may not be uniform because the initial oxide layer is not completely removed.

Therefore, it would be desirable to have a process for preventing these dark spots or defects from forming on oxide layers during the manufacturing process in order to achieve a higher overall yield of acceptable wafers.

BRIEF SUMMARY OF THE INVENTION

A method of forming uniform oxide layers on a semiconductor substrate by reducing descum induced defects is disclosed. The semiconductor substrate includes a wafer, an oxide layer on the wafer and a developed photoresist mask on the oxide layer. In one embodiment, the semiconductor substrate is heated prior to descumming. In an alternative embodiment, the photoresist mask is cured prior to heating and descumming.

Other features and advantages of the present invention will be apparent from the detailed description of the invention.

It should be appreciated that for simplicity and clarity of illustration, elements shown in the Figures have not necessarily been drawn to scale. For example, dimensions of some of the elements are exaggerated relative to each other for clarity.

DETAILED DESCRIPTION OF THE INVENTION

Figure 2:
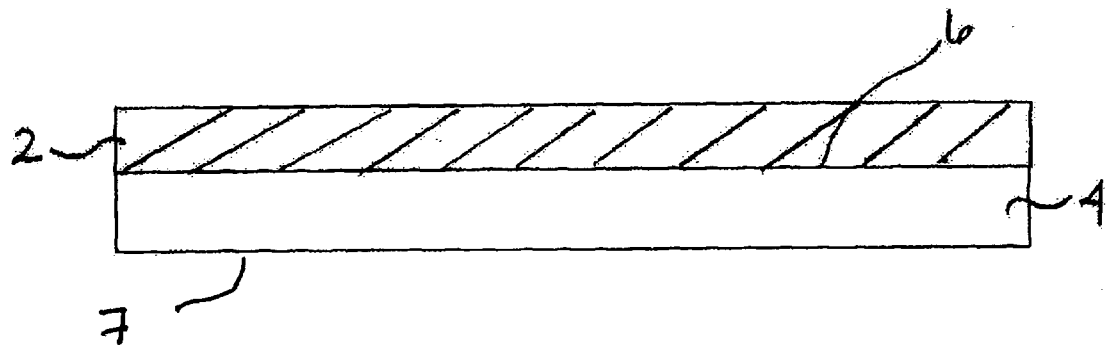
FIG. 2 is a partial cross-sectional view of an oxide layer formed on a wafer substrate.

Referring to FIG. 2, first oxide layer 2, a select gate oxide layer, is formed to overlie the surface of semiconductor substrate 4. Preferably, semiconductor substrate 4 is a single crystal silicon substrate. Semiconductor substrate 4 has an upper surface 6 previously processed to remove debris and native oxides and a bottom surface 7. Preferably, first oxide layer 2 is formed by thermally oxidizing surface 6 at an elevated temperature in the presence of dry molecular oxygen. Preferably, the oxidation process is carried out at a temperature of about 700 to about 1500° C. The oxidation process forms a silicon oxide layer preferably having a thickness of about 50 to about 150 angstroms, and more preferably a thickness of about 100 angstroms. The oxidation process can be carried out in a batch-type thermal oxidation furnace.

Figure 3:
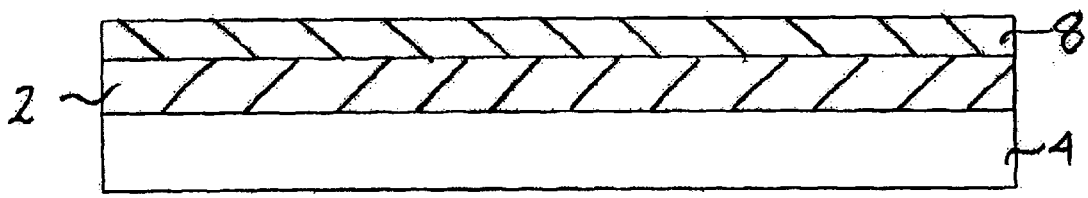
FIG. 3 is a partial cross-sectional view of the substrate after the formation of a photoresist layer on the oxide layer.
Figure 4:
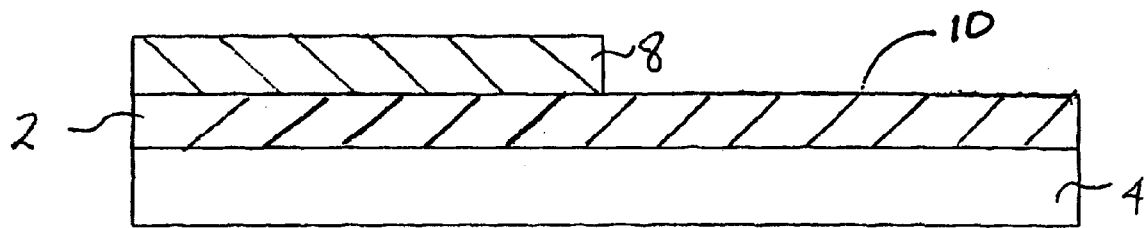
FIG. 4 is a partial cross-sectional view of the wafer substrate after the photoresist has been developed exposing a region of the oxide layer.

After forming the first oxide layer, the substrate is processed to remove any impurities, and a photoresist layer 8 is formed to overlie the first oxide layer as illustrated in FIG. 3. Preferably, photoresist layer 8 is ultraviolet sensitive and is a positive resist. Selected portions of the photoresist layer 8 are then exposed through a mask. The exposed photoresist is then developed and removed leaving a portion 10 of the oxide layer exposed. The photoresist layer may be developed by methods generally known in the art including but not limited to, immersion, spray and puddle techniques. FIG. 4 illustrates the exposed portion 10 of the oxide layer 2.

Figure 1:
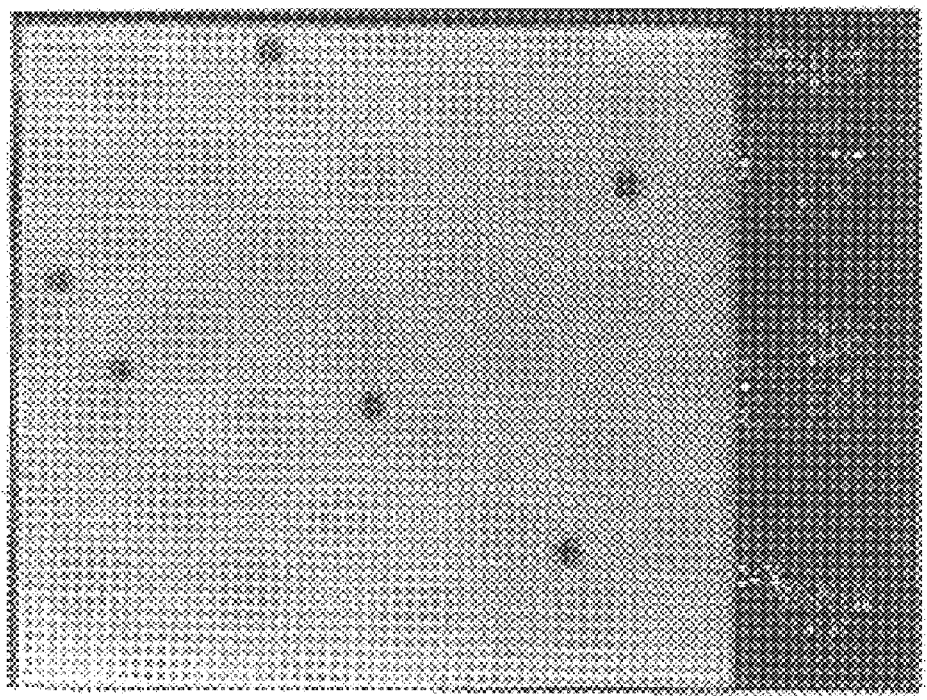
FIG. 1 is a photograph of the unwanted dark spots on a wafer substrate after ashing.

After the photoresist is developed, the substrate is generally descummed using $O_2$ chemistries such as $O_2$, $O_2/N_2$, $O_2/ N_2$—$H_2$, or $O_2/He/Ar$ to remove any undeveloped or residual photoresist. The wafer temperature during a conventional descum process is generally between 80–100° C. However, as previously discussed, dark spots or defects may occur on the oxide layer 2 after the descum process. It is believed that photo active compound left over from developing the photoresist adheres to "cold spots" on the exposed portion of the oxide layer during the descumming process, and causes the dark spots to form as shown in FIG. 1.

It has been discovered that if the substrate is heated before descumming, "cold spots" on the wafer are eliminated, thus preventing the formation of dark spots on the exposed region of the oxide layer. The substrate may be heated by any method well known in the art of semiconductor processing. In one embodiment of the present invention, the substrate is heated by a lamp in an enclosed treatment chamber. In a preferred embodiment, the wafer is placed under a halogen lamp with a power of 120V/1000 W at 80% power or 800 W for 24 seconds. In an alternative embodiment, the substrate is positioned over a horizontally disposed heated stage in an enclosed treatment chamber. Preferably, the heated stage is at a temperature from 200–270° C. The bottom surface 7 of the substrate rests horizontally on top of pins, which extend through openings in the stage. Thus, the semiconductor substrate and stage are in parallel horizontal planes. In order to heat the substrate, the pins are lowered until the bottom of the substrate is resting on the top of the stage. In a preferred embodiment, the substrate remains on the stage for from two to five seconds and is heated to a temperature from 100 to 140° C. In another preferred embodiment, the substrate remains on the stage for three seconds and is heated to about 130° C. Once the substrate is heated, the pins are raised so the bottom surface of the substrate is no longer in contact with the surface of the stage.

Figure 5:
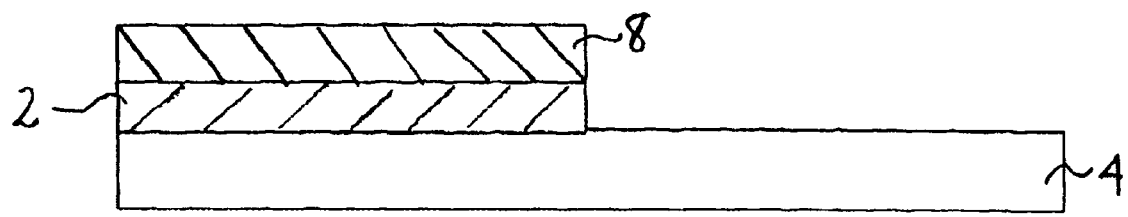
FIG. 5 is a partial cross-sectional view of the wafer substrate after the oxide layer has been etched.

After the heating step, the substrate is descummed in order to remove any residue that is leftover from developing the photoresist layer. The descum process can be carried out in a conventional barrel type batch asher or a downstream wafer to wafer asher. After the substrate has been descummed, the exposed region of oxide layer 10 is etched or stripped as illustrated in FIG. 5. The oxide layer may be etched by conventional wet or dry methods that are well known in the art semiconductor fabrication. Dry etch methods that can be used to etch the exposed region of the oxide layer include plasma etching, ion milling, and reactive ion etching. Wet etch methods include using hydrofluoric acid. Preferably, a buffered oxide etch of hydrofluoric acid, ammonium fluoride and water is used to etch the exposed region of the oxide layer.

Figure 6:
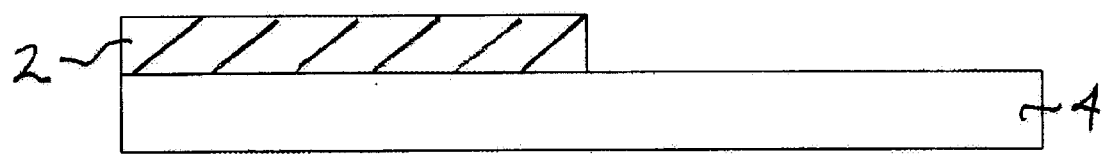
FIG. 6 is a partial cross-sectional view of the wafer substrate after the photoresist layer has been stripped.
Figure 7:
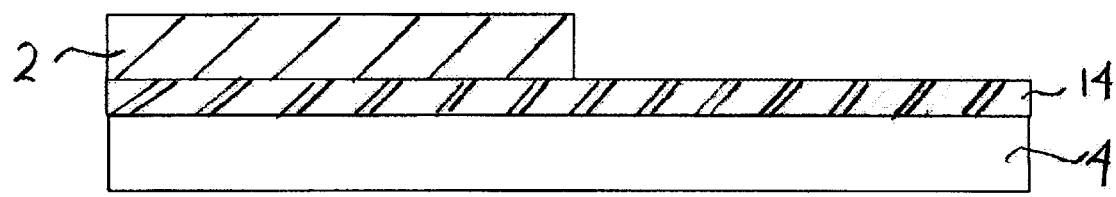
FIG. 7 is a partial cross-sectional view of the wafer substrate after a new layer of oxide has been grown.

After the exposed region of the oxide layer is etched, the remaining photoresist 8 is stripped as shown in FIG. 6. Both wet and dry methods that are well known in the art of semiconductor fabrication can be used to strip the remaining photoresist layer 8. Such methods include but are not limited to use of sulfuric acid and oxidant solutions and conventional $O_2$ plasma stripping. A new oxide layer 14, a tunnel oxide layer, is then grown over the first oxide layer 2 and the wafer substrate 4 as shown in FIG. 7 to produce multiple thickness oxide layers.

When heating the substrate, it is important not to over heat the substrate as overheating will cause the layer of photoresist to begin to melt which will in turn create problems during subsequent processing steps. To prevent the flow of the photoresist during some processes, the substrate may be subjected to an ultraviolet (UV) curing process prior to heating. The UV cure process hardens the photoresist prior to heating step to ensure that the photoresist profile is maintained. Any UV cure methods well known in the art of semiconductor fabrication may be used to cure the photoresist. In a preferred UV cure process, the substrate is placed in an enclosed treatment chamber under a UV source and heated for between 40 to 50 seconds. In particular, the substrate is placed beneath a UV lamp, which is set at "low power", 1800–2200 W and 100–110 mW/cm$^2$, for 10 seconds. The power of the UV lamp is then increased to "high power", 4400–4800 W and 275 mW/cm$^2$, and the substrate remains under the UV lamp for an additional 35 seconds. While the wafer is beneath the UV lamp, the wafer is on heated stage or plate. For the first 20 seconds of the UV cure process, the heated stage is at a temperature of 110° C. Then, for the last 25 seconds of the UV cure process, the temperature of the heated stage is raised from 110° C. to 130° C. at a rate of 0.8° C./sec. If the temperature of the heated stage is increased too quickly, the photoresist may wrinkle, swell or bubble which will destroy the desired photoresist profile.

The processes discussed above are described in more detail in the examples below. It should be understood that that the present invention is not deemed limited to these specific examples.

EXAMPLE 1

In an enclosed treatment chamber, the substrate is placed on pins, which are above a heated stage having a temperature of 200° C. The pins are lowered, and the bottom surface of the substrate is in contact with the heated stage for 3 seconds. The pins are then raised so that the substrate is no longer in contact with the heated stage. Subsequently, the substrate is descummed by ashing for 2 seconds under the following conditions: RF=100 W; Pressure=1200 mT; $O_2/N_2$ Ratio=2000/200 sccm.

EXAMPLE 2

In an enclosed treatment chamber, the substrate is placed on pins, which are above a heated stage having a temperature of 250° C. The substrate is UV cured by the preferred process described above. The pins are lowered, and the bottom surface of the substrate is in contact with the heated stage for 3 seconds. The pins are then raised so that the substrate is no longer in contact with the heated stage. Subsequently, the substrate is descummed by ashing for 10 seconds under the following conditions: RF=100 W; Pressure=1200 mT; O2/N$_2$ Ratio=2000/200 sccm.

EXAMPLE 3

In an enclosed treatment chamber, the substrate is placed on pins, which are above a heated stage having a temperature of 270° C. The substrate is UV cured by the preferred process described above. The pins are lowered and the bottom surface of the substrate is in contact with the heated stage for 3 seconds. The pins are then raised so that the substrate is no longer in contact with the heated stage. Subsequently, the substrate is descummed by ashing for 10 seconds under the following conditions: RF=1100 W; Pressure=1400 mT; $O_2$=3550 sccm.

EXAMPLE 4

In an enclosed treatment chamber, the substrate is placed on pins, which are above a heated stage having a temperature of 270° C. The substrate is UV cured by the preferred process described above, and then heated by a halogen lamp at 800 W for 24 seconds. Subsequently, the substrate is descummed by ashing for 10 seconds under the following conditions: RF=1100 W; Pressure=1400 mT; $O_2$=3550 sccm.

Figure 8:
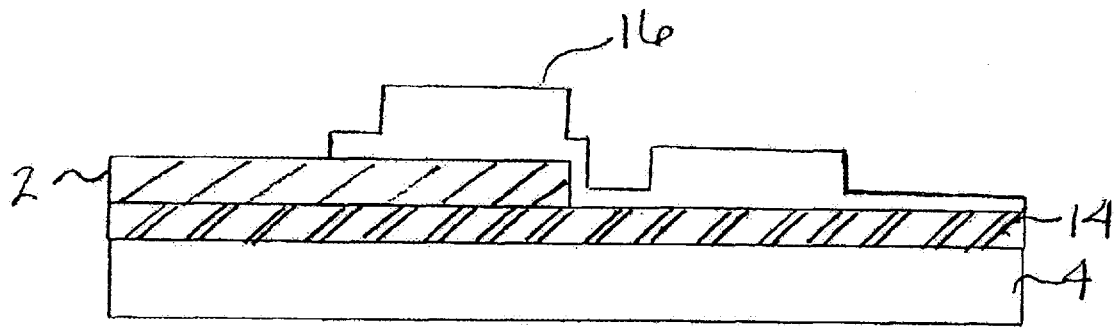
FIG. 8 is a partial cross-sectional view of a wafer substrate after the formation of a floating gate on the first and second oxide layers.
Figure 9:
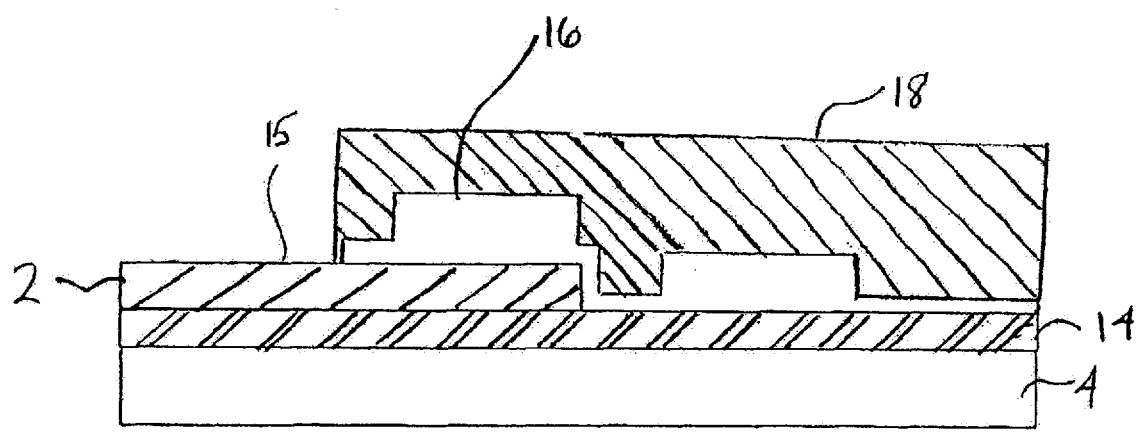
FIG. 9 is a partial cross-sectional view of a wafer substrate after formation and development of a photoresist layer and after the substrate has been descummed.
Figure 10:
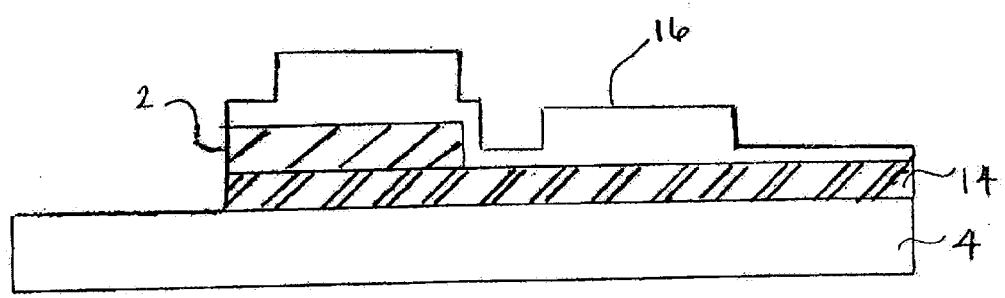
FIG. 10 is a partial cross-sectional view of a wafer substrate after the oxide layers have been etched.
Figure 11:
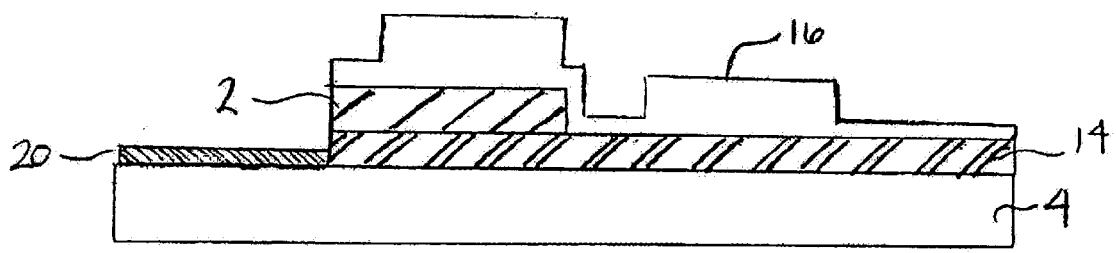
FIG. 11 is a partial cross-sectional view of the wafer substrate after a third layer of oxide has been grown.

The process described above may be repeated to create additional oxide layers with various thicknesses. For example, after growing the tunnel oxide layer 14, a floating gate 16 is formed over oxide layers 2 and 14 as shown in FIG. 8. A photoresist layer 18 is then formed to overlie oxide layers 2 and 14 and gate structure 16. As shown in FIG. 9, the photoresist layer 18 is exposed through a mask, and the exposed photoresist is then developed leaving a portion 15 of oxide layers 2 and 14 exposed. After the resist is developed, the photoresist is UV cured and heated before the substrate is descummed. Then, the exposed portion 15 of oxide layers 2 and 14 is etched away and the remaining photoresist is stripped away as shown in FIG. 10. As illustrated in FIG. 11, a third oxide layer 20, the peripheral gate oxide layer, having a thickness different than oxide layers 2 and 14 is grown on the surface of wafer substrate 4.

Thus, there has been disclosed in accordance with the invention a process for fabricating multiple uniform oxide layers in a semiconductor device that fully provides the advantages set forth above. Although the invention has been described and illustrated with reference to specific illustrative embodiments thereof, it is not intended that the invention be limited to those illustrative embodiments. Those skilled in the art will recognize that variations and modifications can be made without departing from the spirit of the invention. It is therefore intended to include within the invention all such variations and modifications that fall within the scope of the appended claims and equivalents thereof.

What is claimed is:

1. A method for fabricating a semiconductor structure, comprising:
    heating a substrate by placing the substrate on a surface having a temperature from 200° C. to 270° C. for from 2 to 5 seconds, said substrate comprising:
    (a) a wafer;
    (b) a first oxide layer on the wafer;
    (c) a developed photoresist mask on said first oxide layer; and
    (d) at least one exposed region on the first oxide layer;
    and descumming the exposed portion of the first oxide layer.

2. The method claim 1, wherein heating the substrate further comprises placing the substrate on pins that extend through and above the surface; lowering the substrate onto the surface to heat the wafer; and lifting the substrate above the surface.

3. The method of claim 1, wherein after heating the temperature of the substrate is from 100° C. to 140° C.

4. The method of claim 1, wherein after heating the temperature of the substrate is 130° C.

5. The method of claim 1, wherein the descummed substrate is prepared by an $O_2$, $O_2/N_2$, $O_2/N_2$—$H_2$ or $O_2$/He/Ar ashing process.

6. The method of claim 1, further comprising etching the first oxide layer.

7. The method of claim 6, wherein the etching is selected from the group consisting of plasma etching, ion milling etching, reactive ion etching and hydrofluoric acid based etching.

8. The method of claim 6, further comprising stripping the photoresist mask.

9. The method of claim 8, further comprising growing a second oxide layer on the substrate.

10. In a method of fabricating a semiconductor structure, including growing a first oxide layer on a semiconductor substrate, depositing a layer of photoresist over the first oxide layer, exposing and developing the photoresist layer, descumming the substrate to remove any photoresist residue, etching the first oxide layer, stripping the remaining photoresist and growing a second oxide layer, the improvement comprising: heating the substrate before descumming by placing the substrate on a heated surface having a temperature from 200° C. to 270° C. for from 2 to 5 seconds.

11. A method of fabricating a semiconductor substrate comprising:
heating a substrate by placing the substrate on a surface having a temperature from 200° C. to 270° C. for from 2 to 5 seconds, said substrate comprising:
(a) a wafer;
(b) a first patterned oxide layer on the wafer;
(c) a second oxide layer on the first oxide layer;
(d) a developed photoresist mask on said second oxide layer; and
(e) at least one exposed region on the second oxide layer; descumming the substrate;
etching said at least one exposed region of the second oxide layer;
stripping the photoresist; and
growing a third layer of oxide on the substrate.

12. A method of fabricating a semiconductor substrate comprising:
heating a substrate by placing the substrate on a surface having a temperature from 200° C. to 270° C. for from 2 to 5 seconds, said substrate comprising:
(a) a wafer;
(b) a first oxide layer on the wafer;
(c) a developed and cured photoresist mask on said first oxide layer; and
(d) at least one exposed region of the oxide layer;
and descumming the exposed portion of the oxide layer.

13. The method of claim 12, wherein the photoresist mask is cured by placing the substrate on a heated stage under a UV lamp for from 40–50 seconds.

14. The method of claim 12, wherein after heating the temperature of the substrate is from 100° C. to 140° C.

15. The method of claim 12, wherein after heating the temperature of the substrate is 130° C.

16. The method of claim 12, wherein the descummed substrate is prepared by an $O_2$, $O_2/N_2$, $O_2/N_2$—$H_2$, or $O_2/He/Ar$ ashing process.

17. The method of claim 12, further comprising etching the oxide layer.

18. The method of claim 17, wherein the etching is selected from the group consisting of plasma etching, ion milling etching, reactive ion etching and hydrofluoric acid based etching.

19. The method of claim 17, further comprising stripping the photoresist mask.

20. The method of claim 19, further comprising growing a second oxide layer on the substrate.

21. A method of fabricating an electronic device comprising:
making a semiconductor structure by the method comprising:
step for heating a substrate, said substrate comprising:
(a) a wafer;
(b) a first oxide layer on the wafer;
(c) a developed and cured photoresist mask on said first oxide layer; and
(d) at least one exposed region of the oxide layer;
and descumming the exposed portion of the first oxide layer;
and forming an electronic device comprising said semiconductor structure.

* * * * *